United States Patent [19]
Tsujimoto

[11] Patent Number: 4,728,829
[45] Date of Patent: Mar. 1, 1988

[54] TIMER CIRCUIT

[75] Inventor: Jun-ichi Tsujimoto, Yokohama, Japan

[73] Assignee: Kabushiki Kaisha Toshiba, Kawasaki, Japan

[21] Appl. No.: 724,417

[22] Filed: Apr. 18, 1985

[30] Foreign Application Priority Data

Apr. 20, 1984 [JP] Japan ................................ 59-79655

[51] Int. Cl.$^4$ ................. H03K 17/296; H03K 17/687
[52] U.S. Cl. .................................... 307/590; 307/594; 307/605; 307/246
[58] Field of Search ............... 307/590, 591, 594, 598, 307/605, 607, 246, 304, 303, 603; 365/189, 194

[56] References Cited

U.S. PATENT DOCUMENTS 4,584,494 4/1986 Arakawa et al. .................. 307/246

Primary Examiner—Stanley D. Miller
Assistant Examiner—Timothy P. Callahan
Attorney, Agent, or Firm—Schwartz, Jeffery, Schwaab, Mack, Blumenthal & Evans

[57] ABSTRACT

A timer circuit which is used for write and erase time control of a semicondcutor memory, and configured so as to transfer a charge of a charge storage capacitor to a charge pump capacitor through a first transfer gate thereafter to repeatedly effect a discharge operation by using a second transfer gate thereby to gradually reduce a charge of the charge storage capacitor, thus performing a timer operation, characterized in that there is provided a circuit for making an adjustment such that a voltage applied to the charge pump capacitor is smaller than a voltage applied to the charge storage capacitor.

5 Claims, 6 Drawing Figures

TIMER CIRCUIT

BACKGROUND OF THE INVENTION

1. Field of the Art

The present invention relates to a timer circuit used for controlling a write and erase time of $E^2PROM$ (Electrical Erasable Programmable Read Only Memory), etc.

2. Prior Art

Hitherto, there has been proposed a timer circuit used for a write and erase time control of a semiconductor memory, wherein its timer operation is performed by transferring a charge stored in a charge storage capacitor to a charge pump capacitor through a first transfer gate thereafter to repeatedly effect a discharge operation by using a second transfer gate, thus gradually lessening the charge in the charge storage capacitor.

However, the drawback with the above-mentioned conventional timer circuit is that a large capacity ratio of the timer is required for assuring a prolonged operation time, resulting in enlargement of LSI.

SUMMARY OF THE INVENTION

With the above in mind, an object of the present invention is to provide a timer circuit having a capacity ratio of two capacitors set as small as possible and a timer interval sufficiently longer than a time period T of a fundamental clock.

To achieve this object, a timer circuit according to the present invention is characterized in that an adjustment is made such that a voltage applied to a charge pump capacitor is always smaller than a voltage applied to a charge storage capacitor, thereby making it possible to provide a small charge pumping amount per each operation even if the capacity ratio of the both capacitors is small, thus assuring a timer period sufficiently longer than a time period T of a fundamental clock.

DETAILED DESCRIPTION OF THE INVENTION

Technical Background of the Invention and its Problems

Figure 1:
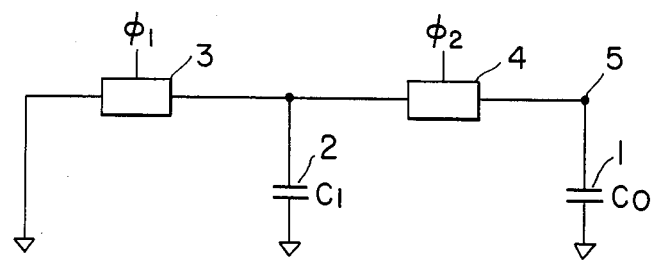
FIG. 1 is a circuit diagram illustrating a prior art timer circuit to which the switched capacitor technique is applied.

Referring to FIG. 1, there is shown a prior art timer circuit to which the switched capacitor technique is applied. The timer circuit shown in this figure comprises a charge storage capacitor 1 having a capacity $C_0$, a charge pump capacitor 2 having a capacity $C_1$, and two transfer gates 3 and 4 which are opened and closed in accordance with fundamental clocks $\phi_1$ and $\phi_2$, respectively. The operation of the circuit is as follows. First, a charge is supplied to a node 5 by a reset operation thereby to charge the capacitor 1. It is assumed that a potential at the node 5 in this case is $V_0$. The fundamental clock $\phi_1$ has the same frequency as that of the fundamental clock $\phi_2$ and an inverted phase with respect to a phase of the fundamental clock $\phi_2$. The transfer gates 3 and 4 are operative in a manner that when one is opened, the other is closed. When the transfer gate 4 is opened, a part of the charge which has been stored in the capacitor 1 is transferred to the capacitor 2. Assuming now that a potential at the node 5 in this case is $V_1$, the following equation (1) holds and the following equation (2) can be derived from the equation (1):

$$C_0 V_0 = C_0 V_1 + C_1 V_1 \qquad (1)$$

$$V_1 = (C_0/(C_1+C_0))V_0 \qquad (2)$$

Subsequently, when the transfer gate 4 is closed, the transfer gate 3 is opened to discharge the charge which has been stored in the capacitor 2. The above-mentioned operation will be repeatedly carried out in correspondence with a time period of the fundamental clocks $\phi_1$ and $\phi_2$, thus to gradually discharge the charge which has been stored in the capacitor 1. Assuming now that the time period of the fundamental clocks $\phi_1$ and $\phi_2$ is T, a potential V(t) at the node 5 in the case where reset operation is effected at a time of t=0 is expressed by the following equation (3):

$$V(t) = (C_0/(C_1+C_0))^{t/T} V_0 \qquad (3)$$

A time required until the potential V(t) is less than a predetermined value is utilized for a timer operation.

In the above-mentioned conventional timer circuit, the potential V(t) at the node 5 decreases as an exponential function of time as understood from the equation (3). For this reason, it is required to set the capacity ratio $C_0/C_1$ to an extremely large value in order to constitute a timer having an operation time sufficiently longer than the time period T of the fundamental clock. This results in the large occupation area of capacitors within a wafer for an LSI circuit.

Preferred Embodiments of the Invention

Figure 2:
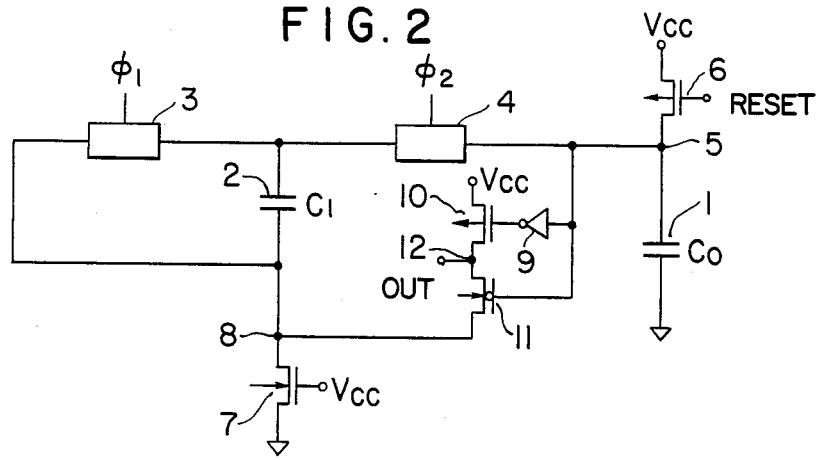
FIG. 2 is a circuit diagram illustrating an embodiment of a timer circuit according to the present invention.

Referring to FIG. 2, there is shown an embodiment of a timer circuit according to the present invention. Circuits components identical to those shown in FIG. 1 are represented by the same reference numerals, respectively, and their explanation will be omitted.

A P-type MOS transistor 6 is a transistor serving as a reset switch coupled between a power supply terminal Vcc and the node 5. A ground terminal of the charge pump capacitor 2 is grounded through an N-type MOS transistor 7 having a small conductance gm. The ground terminal of the capacitor 2 is connected to the output of the transfer gate 3. A circuit for adjusting a potential at a node 8 is connected between the nodes 5 and 8 and comprises an inverter 9, a P-type MOS transistor 10 and an N-type MOS transistor 11. A transistor which provides a small back-bias effect is used for the transistor 11.

The circuit of FIG. 2 operates as follows: When a signal is applied to the gate of the transistor 6 to reset the circuit, a charge is stored in the capacitor 1. It is assumed that a potential at the node 5 in this case is $V_0$. When the transfer gate 4 is opened, a part of the charge which has been stored in the capacitor 1 is transferred to the capacitor 2. At this time, because the conductance gm of the transistor 7 is small, a potential level at the node 8 is fairly greatly biased with respect to the ground level and a voltage applied to the capacitor 2 becomes considerably smaller than a voltage applied to the capacitor 1. Assuming that a potential at the node 5 in this case is $V_1$, the value of $V_1$ is approximately expressed by the following equation (4):

$$V_1 = V_0 - C_1/C_0 A - C_1/C_0 K \sqrt{V_0 - A} \quad (4)$$

$$A = \sqrt{gm_1/gm_2}, \quad (5)$$

where $gm_1$, $gm_2$ and K denote conductance of the transistor 7, conductance of the transistor 11 and coefficient of back-bias effect of the transistor 11, respectively. If the conductance $gm_1$ is set to a value smaller than the conductance $gm_2$, the coefficient K of back-bias effect is nearly equal to 0.2 because the transistor 11 has a small back bias-effect, thus making it possible to provide a small difference between the potentials $V_0$ and $V_1$. Subsequently, when the transfer gate 4 is closed, the transfer gate 3 is opened, thus to discharge the charge which has been stored in the capacitor 2. By repeatedly carrying out the above operation based on the time period of the fundamental clocks $\phi_1$ and $\phi_2$, the charge which has been stored in the capacitor 1 is gradually discharged. An adjustment is made such that the potential at the node 8 is automatically lowered according as the potential at the node 5 lowers by an amount of a threshold voltage of transistor 11. Thus, this ensures that the voltage applied to the capacitor 2 is always smaller than the voltage applied to the capacitor 1. The potential at the node 5 substantially linearly decreases in accordance with the equation (4). When attention is drawn to the potential at node 12, it is seen that this potential is nearly equal to Vcc as long as the transistor 10 is turned on and becomes zero volts when the transistor 10 turns off. Because the on-off operation of the transistor 10 is controlled through the inverter 9 on the basis of a potential at the node 5, a timer function can be eventually obtained by detecting the potential at the node 12. In this instance, such a detection can be easily effected because the potential at the node 12 takes the value of 5 V or 0 V. The node 12 is connected to an output terminal OUT so that the output terminal OUT provides an output voltage $V_{12}$.

Figure 5:
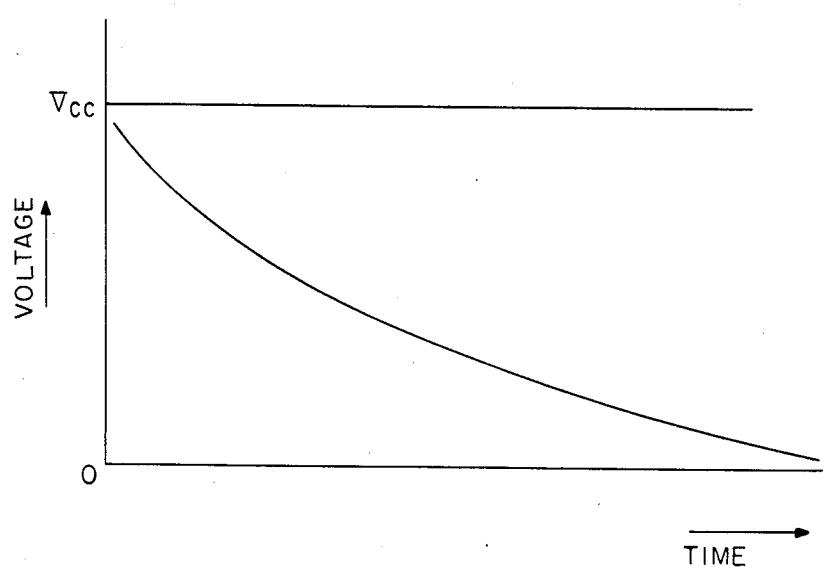
FIG. 5 shows the voltage variation at a node 5 of the prior art circuit of FIG. 1.

FIG. 5 shows a variation of the voltage of the node 5 of the prior art circuit in FIG. 1, $V_5$ representing the voltage of the node 5. According to FIG. 5, voltage $V_5$ decreases in an exponential fashion as is well known.

Figure 6:
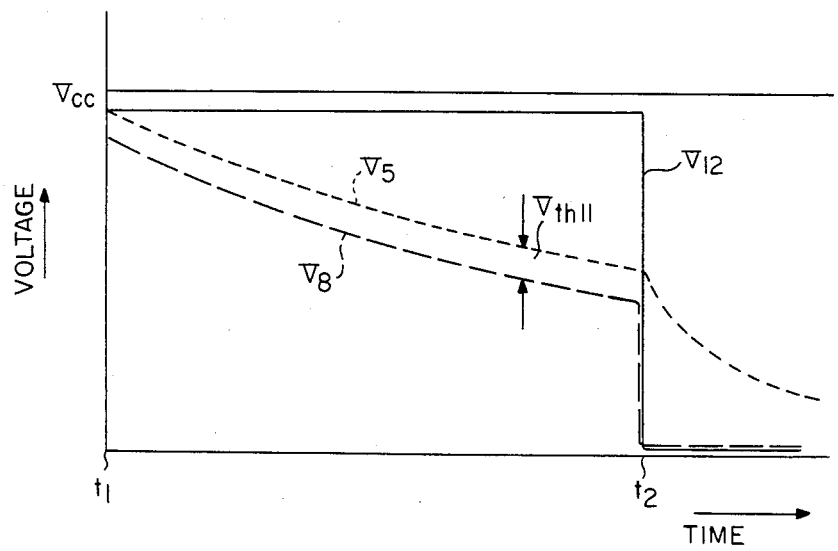
FIG. 6 illustrates voltage variations at nodes 5, 8 and 12 of the embodiment of the invention illustrated in FIG. 2.

FIG. 6 shows variations of the voltages of the nodes 5, 8 and 12 of the circuit of the present invention in FIG. 2, $V_5$ representing the voltage of the node 5, $V_8$ the voltage of the node 8 and $V_{12}$ the voltage of the node 12.

Comparing FIG. 6 to FIG. 5, it is clearly understood that $V_5$ and $V_8$ in FIG. 6 decrease from a time $t_1$, when a signal is applied to a reset terminal RESET, to a time $t_2$, when a time duration of the timer has passed, in less than an exponential fashion, namely, in substantially a linear fashion. $V_8$ is smaller than $V_5$ by the amount of $V_{th11}$ which represents the threshold voltage of the transistor 11, and $V_8$ is higher than the ground level by the amount of voltage drop across the drain and the source of the transistor 7.

As $V_5$ decreases from the voltage, which is almost equal to Vcc, i.e., 5 V, to around 2.5 V, the inverter 9 inverts its output so that the transistor 10 turns off, turning off the transistors 11 and 7. Thus $V_{12}$, which is the voltage of the node 12, namely, the output voltage at the output terminal OUT, drops to the ground level.

The advantages experimentally confirmed in a quantitative manner in connection with the above-mentioned embodiment will be described. The following settings are now assumed: At a time of $t=0$, a reset operation is effected and a voltage $V_0$ at this time is equal to 5 volts; the value of the conductance $gm_2$ of the transistor 11 is larger than that of the conductance $gm_1$ of the transistor 7 and the factor A expressed by the equation (5) is equal to 0.1; and the coefficient K of back-bias effect is equal to 0.2 because a transistor having small back-bias effect is used for the transistor 11.

By performing the substitution of the above values into the equation (4) in order to calculate the potential $V(t)$ at the node 5, the equation (6) is derived from the equation (4) as follows.

$$V(t) \simeq 5 - 0.5 C_1/C_0 \cdot t/T \quad (6)$$

As understood from this equation (6), the potential $V(t)$ linearly decreases with respect to time and the capacity ratio $(C_1/C_0)$ is multiplied by the factor of 0.5. Accordingly, when the same capacity ratio $C_1/C_0$ as that of the prior art timer circuit is employed, a timer circuit having a time interval about ten times longer that that of the prior art timer circuit can be obtained.

Figure 3:
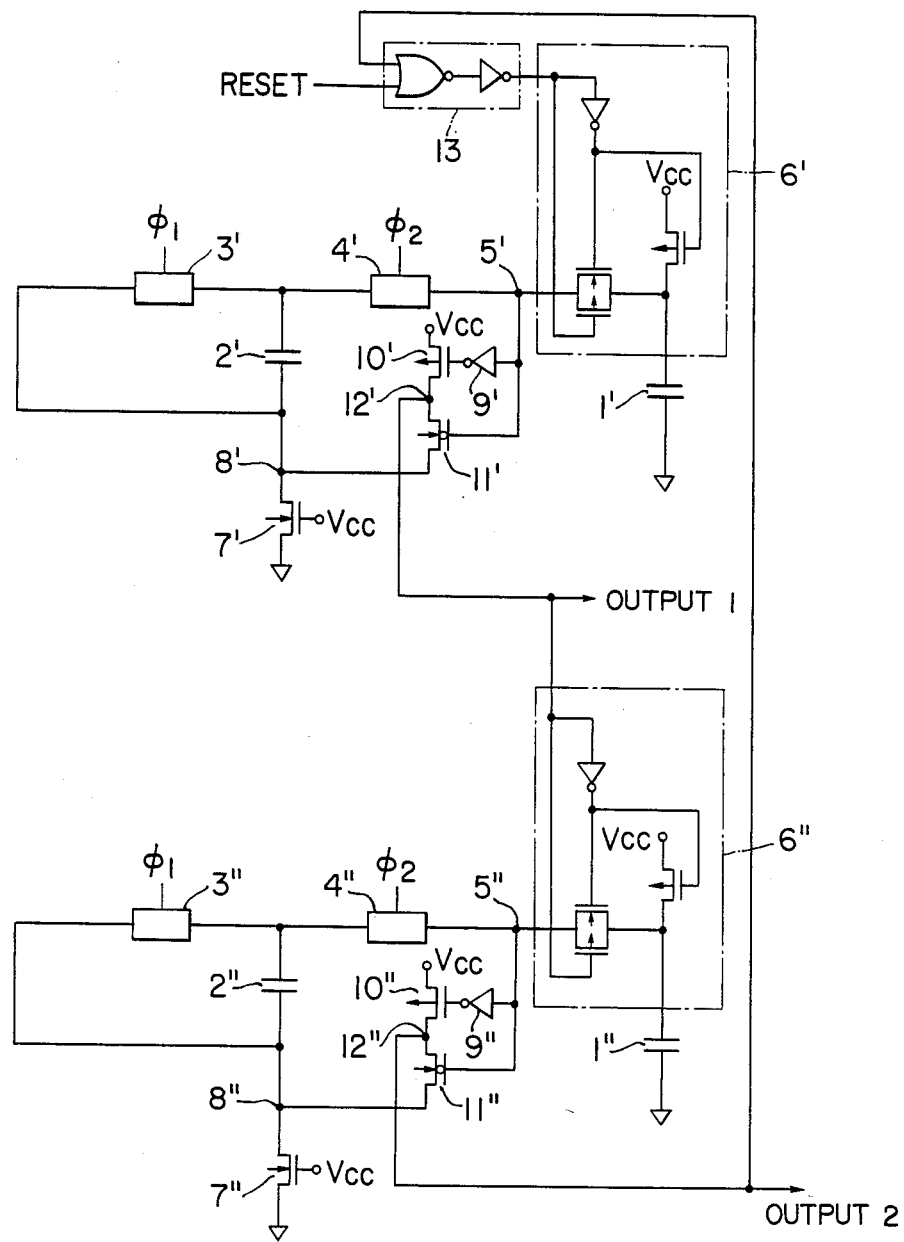
FIG. 3 is a circuit diagram illustrating another embodiment of a timer circuit according to the present invention.

Referring to FIG. 3, there is shown another embodiment of a timer circuit according to the present invention. The timer circuit in this embodiment comprises a pair of timer circuit each of which corresponds to the circuit employed in the first-mentioned embodiment of the invention. Accordingly, in regard to one circuit, a prime is attached to each of circuit components corresponding to those shown in FIG. 2 while in regard to the other circuit, double primes are attached to each circuit component corresponding thereto, and their explanation will be omitted. A reset circuit 13 is used for resetting the entire circuit. In the embodiment of FIG. 3, the pair of timer circuits are coupled in a manner that outputs from one and the other timer circuits are supplied respectively to each other as reset inputs. Accordingly, after the entire circuit is reset, outputs 1 and 2 are phase-inverted with respect to each other, thus producing a rectangular wave signal having a time period set in the timer circuit. It is possible to extremely prolong (e.g., one thousand times) this time period is compared to the time period T of the clocks $\phi_1$ and $\phi_2$.

Figure 4:
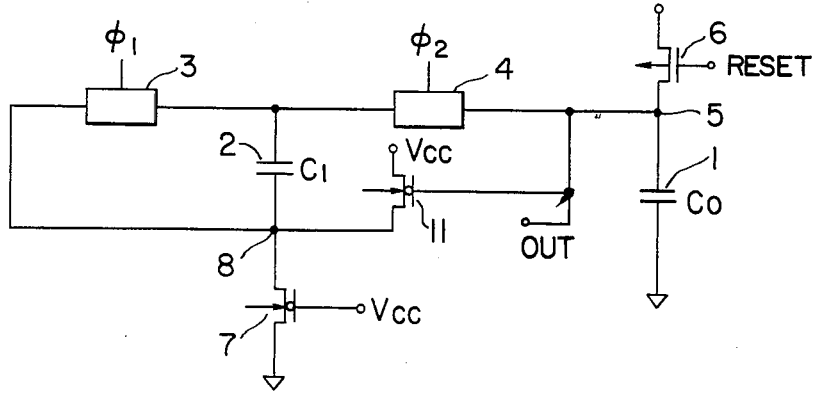
FIG. 4 is a circuit diagram illustrating a further embodiment of a timer circuit according to the present invention.

Referring to FIG. 4, there is shown a further embodiment of a timer circuit according to the present invention. The timer circuit in this embodiment has a feature that the inverter 9 and the P-type MOS transistor 10 in FIG. 2 are eliminated so that the circuit is simpler than that of FIG. 2 in structure, thereby being less responsive. In this case, the output terminal OUT is connected to the gate electrode of the transistor 11 and provides $V_5$ as its output voltage. As mentioned above and shown in FIG. 6, $V_5$ decreases more gradually than $V_{12}$, even at the time $t_2$. Therefore, proper signal processing may be needed to detect the variation of $V_5$ at the next stage which receives the output signal from the terminal OUT.

As stated above, with the timer circuit according to the present invention, an adjustment is made so that a voltage applied to a charge pump capacitor is always smaller than a voltage applied to a charge storage capacitor. Even in the case where a timer circuit having a time interval sufficiently longer than the time period T of the fundamental clock is required, the occupation area of the both capacitors can be reduced.

What is claimed is:

1. A timer circuit comprising:
   (a) a charge storage capacitor having a first terminal and a second terminal connected to ground;
   (b) a charge pumping capacitor having a first terminal and a second terminal;
   (c) a first transistor means for connecting the first terminal of said charge storage capacitor to a power supply when a reset signal is applied thereto;
   (d) a second transistor means coupled serially between said second terminal of said charge pumping capacitor and ground to keep the potential at said second terminal higher than ground potential by an amount of voltage drop of said second transistor means;
   (e) a first transfer gate means connected between the first terminals of said charge storage and charge pumping capacitors to periodically transfer a part of a charge stored in said charge storage capacitor to said charge pumping capacitor according to one phase signal of a two-phase clock after application of said reset signal;
   (f) a second transfer gate means connected to said second terminal of said charge pumping capacitor to periodically discharge a charge stored in said charge pumping capacitor according to another phase signal of the two-phase clock after application of said reset signal; and
   (g) an adjustment circuit including at least one adjusting transistor means which has a low back-bias effect, connected to said charge storage capacitor to control the potential of the stored charge of said charge storage capacitor within a range determined by a threshold voltage of said adjusting transistor means from the potential of the second terminal of said charge pumping capacitor.

2. A timer circuit as claimed in claim 1 wherein said adjustment circuit includes:
   a P-type and N-type MOSFET means connected in series with each other, said N-type MOSFET means operating as said adjusting MOSFET means and said P-type MOSFET means operating as a switching device for controlling the current flowing into said adjusting MOSFET means from the power supply,
   a level detector which detects the decrease of potential of the charge of said charge storage capacitor to be lower than a predetermined value and provides an output to said P-type MOSFET means to turn off said P-type MOSFET means, and
   an output terminal connected to an interconnected point of said P-type and N-type MOSFET means.

3. A timer circuit as claimed in claim 1 wherein said adjustment circuit comprises:
   an adjusting MOSFET means having one of a source and drain thereof connected to said second terminal of said charge pumping capacitor while the other of said source and drain is connected to a power source, and having a gate thereof connected to receive the potential of said charge storage capacitor, and
   an output terminal connected to the gate of said adjusting MOSFET means.

4. A timer circuit as claimed in claim 1 wherein said adjustment circuit comprises a MOSFET means connected between said second terminal of said charge pumping capacitor and ground, said MOSFET means functioning to allow a potential at said second terminal to be at a ground potential, and a P-type and N-type MOSFET means connected in series with each other, wherein a gate of said P-type MOSFET means is connected to said first terminal of said charge storage capacitor through an inverter and a gate of said N-type MOSFET means is directly connected to said first terminal of said charge storage capacitor.

5. A timer circuit as recited in claim 4 further including an output terminal connected between said serially connected P-type and N-type MOSFET means.

* * * * *